United States Patent [19]
Stecher

[11] Patent Number: 6,143,660
[45] Date of Patent: Nov. 7, 2000

[54] METHOD OF PRODUCING A CONTACT BETWEEN A METALLIZING LAYER AND A SEMICONDUCTOR MATERIAL

[75] Inventor: Matthias Stecher, Villach, Austria

[73] Assignee: Infineon Technologies AG, Munich, Germany

[21] Appl. No.: 09/023,720

[22] Filed: Feb. 13, 1998

[30] Foreign Application Priority Data

Feb. 13, 1997 [DE] Germany .......................... 197 05 530

[51] Int. Cl.[7] .......................... H01L 21/302; H01L 21/76
[52] U.S. Cl. .......................................... 438/689; 438/443
[58] Field of Search .................................. 438/564, 647, 438/657, 689, 439, 444, 443

[56] References Cited

U.S. PATENT DOCUMENTS

| | | |
|---|---|---|
| 5,480,823 | 1/1996 | Hsu ........................................... 437/48 |
| 5,482,888 | 1/1996 | Hsu et al. ................................. 437/70 |
| 5,652,454 | 7/1997 | Iwamatsu et al. ...................... 257/350 |
| 5,831,311 | 11/1998 | Hsu ......................................... 257/355 |

FOREIGN PATENT DOCUMENTS

| | | |
|---|---|---|
| 0 704 894 A2 | 4/1996 | European Pat. Off. . |
| 40 29 256 A1 | 1/1992 | Germany . |

OTHER PUBLICATIONS

International Application No. WO 93/02470 (Blanchard), dated Feb. 4, 1993.

*Primary Examiner*—Brian Dutton
*Attorney, Agent, or Firm*—Herbert L. Lerner; Laurence A. Greenberg; Werner H. Stemer

[57] ABSTRACT

A method for producing a low-impedance contact between a metallizing layer and a semiconductor material and a method for producing a capacitor. The two methods are adapted to one another such that in the course of a single process, both contacts and capacitors can be formed. In particular, by the methods of the invention, the insulation layer, which forms when the first dopant for the contact is forced inward, can be used as a capacitance dielectric of a capacitor.

5 Claims, 2 Drawing Sheets

METHOD OF PRODUCING A CONTACT BETWEEN A METALLIZING LAYER AND A SEMICONDUCTOR MATERIAL

BACKGROUND OF THE INVENTION

Field of the Invention

The invention relates to a method of producing a contact, especially a low-impedance contact, between a metallizing layer and a semiconductor material, and to a method for producing a capacitor.

For semiconductor components in integrated circuits to be able to perform their function, they must be connected to one another through electrically conductive connections. For that purpose, typically one or more connection planes are built up on an integrated circuit. These connection planes are typically made from polysilicon or a metal (metallizing planes). As a result, the problem arises that there must be contacts between the individual semiconductor components and at least one of the metallizing planes or connection planes. The contact between a semiconductor component and a metal layer, for instance, should have favorable ohmic properties, with a low resistance. This is usually achieved by heavily doping the semiconductor material in the contact region. However, in integrated circuits, because of the function the integrated circuit is intended to perform, capacitors are often needed at the same time. Because of the intrinsic differences between capacitors and good ohmic contacts, it was often necessary in the prior art to use different methods to produce them. This made the production process longer, with higher process costs.

SUMMARY OF THE INVENTION

It is accordingly an object of the invention to provide a method of contacting a metallizing layer with a semiconductor material, which overcomes the above-mentioned disadvantages of the prior art devices and methods of this general type and wherein the method for producing a contact and the method for producing a capacitor are adapted to one another in such a way as to avoid additional process costs.

With the foregoing and other objects in view there is provided, in accordance with the invention, a method of producing a contact between a metallizing layer and a semiconductor material. The method comprises the following steps:

forming a silicon nitride layer on a semiconductor material and structuring the silicon nitride layer;
forming a local $SiO_2$ layer by thermal oxidation; and
applying a metallizing layer on the semiconductor material.

Thee silicon nitride layer is structured in such a way that the local $SiO_2$ layer does not cover the entire surface of what will later be the contact.

With the above and other objects in view, there is also provided, in accordance with the invention, a method of creating a capacitor, which comprises the following steps:

applying a silicon nitride layer onto a semiconductor material and structuring the silicon nitride layer;
forming a local $SiO_2$ layer by thermal oxidation;
applying and structuring a conductive layer such that the conductive layer is disposed above the local $SiO_2$ layer;
forming an insulation layer and anisotropically etching the insulation layer down to the semiconductor material, resulting in an insulation at an edge of the conductive layer; and
applying a metallizing layer.

In accordance with a concomitant feature of the invention, subsequently to the step of forming the local $SiO_2$ layer, a further dopant may be implanted into the semiconductor material and then forced further into the material.

The two methods are adapted to one another in such a way that in the course of a single process, both contacts and capacitors can be formed. In particular, by the methods of the invention, the insulation layer, which forms when the first dopant for the contact is forced inward, can be used as a capacitance dielectric of a capacitor. Essentially only process steps that are unavoidable in the creation of further semiconductor components, such as DMOS transistors or npn transistors, are employed.

In accordance with an added feature of the invention, a dopant is introduced into the semiconductor material prior to the thermal oxidation, and the dopant is forced inward by the thermal oxidation.

In accordance with an additional feature of the invention, prior to the applying step, an insulation layer is formed and anisotropically etched down to the semiconductor material. At the same time, the local $SiO_2$ layer is thereby also substantially removed.

In accordance with another feature of the invention, after the local $SiO_2$ layer is formed, a further dopant is introduced into the semiconductor material and the further dopant is forced inward.

In accordance with a further feature of the invention, the silicon nitride layer is removed after the local $SiO_2$ layer is formed.

Finally, the local $SiO_2$ layer may be thinned.

Other features which are considered as characteristic for the invention are set forth in the appended claims.

Although the invention is illustrated and described herein as embodied in a method for creating a contact between a metallizing layer and a semiconductor material, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
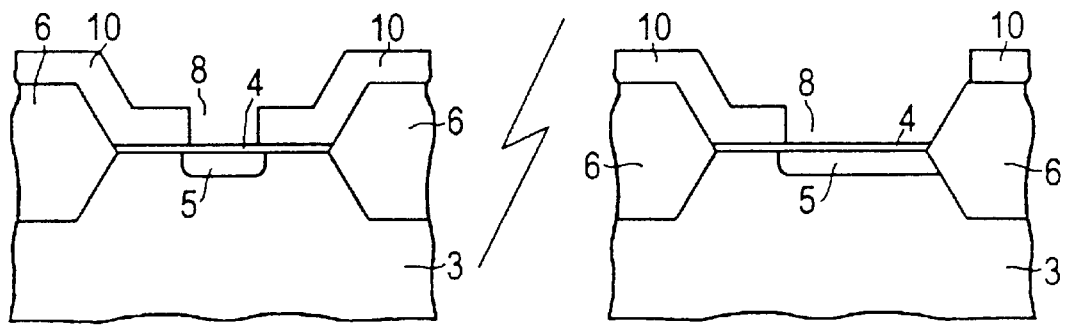
FIG. 1 is a partial, schematic, sectional view taken through an integrated semiconductor system, after a first production sequence.

Referring now to the figures of the drawing in detail and first, particularly, to FIG. 1 thereof, there is seen a portion of an n-doped crystalline semiconductor material 3. An insulation layer 6 has been formed over the surface, for instance by means of a LOCOS process. A thin $SiO_2$ layer 4 is also disposed on the surface of the semiconductor material 3.

Subsequently, a silicon nitride layer 10 ($Si_3N_4$) is applied, which is then subsequently structured. The structuring of the silicon nitride layer 10, at the location at which a relatively thick, local $SiO_2$ layer 9 is to be created, creates the opening 8. A dopant 5 (n-doping) is introduced into the semiconductor material 3 through the opening 8. This can be effected by means of a coating or by an implantation.

Figure 2:
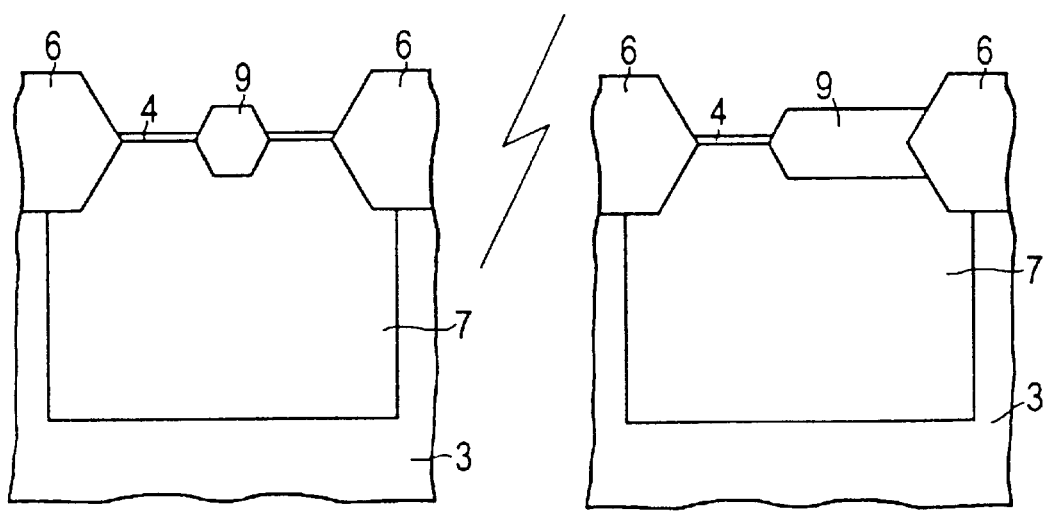
FIGS. 2–4 are similar views illustrating further sequential production steps.

After that, by means of a thermal oxidation process, the dopant is forced farther inward into the semiconductor material 3. This creates a deep diffusion zone 7. At the same time, because of the thermal oxidation, a relatively thick local $SiO_2$ layer 9 grows at the point where there is no silicon nitride layer. The silicon nitride layer 10 is then removed by etching. The resultant structure is illustrated in FIG. 2.

The deep diffusion zone 7 may become the drain terminal, for instance, of a DMOS transistor that is still to be formed. In other configurations, the zone 7 may also perform the function of the collector of an npn transistor still to be formed. Components of this type are described, for instance in European patent application EP-A 0 704 894.

Next, a conductive layer 12 is formed, for instance a polysilicon layer. The polysilicon layer 12 is doped to high conductivity by means of furnace doping. From this layer, the gate of an MOS transistor, for instance, or a resistor, a conductor track, or in particular the second electrode of the capacitor 20 (see FIG. 4) are created.

Figure 4:
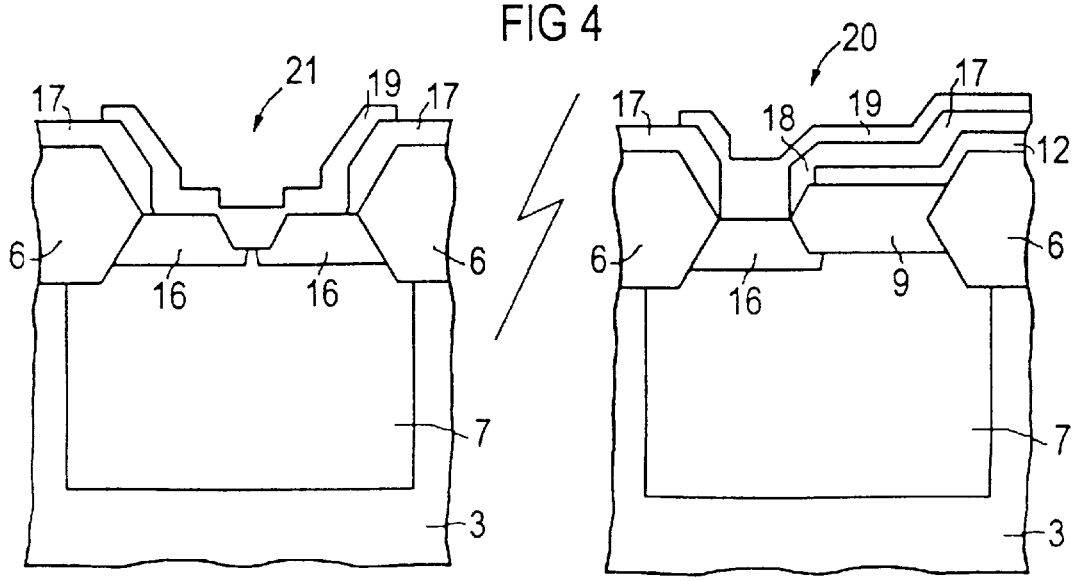

In the next step, the conductive layer 12 is structured by means of a standard photographic technique, so that the conductive layer 12 is removed in the region of the later contact 21 (see FIG. 4).

Figure 3:
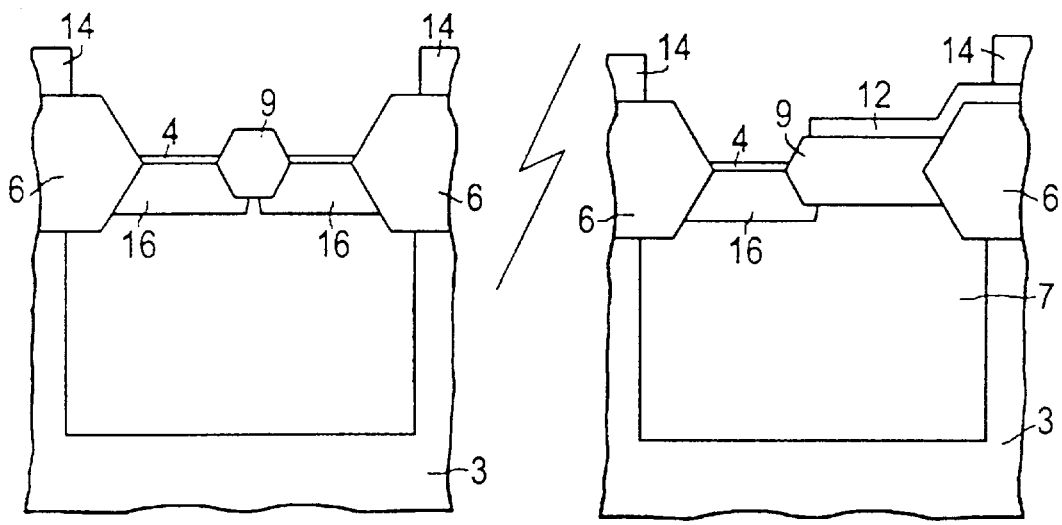

By means of the photoresist 14, $n^+$-doped zones 16 of high conductivity are now created (see FIG. 3) in the semiconductor material 3 in the out-diffusion zone of the deep diffusion zone 7. This is done by the introduction (such as implantation) and driving inward of a further dopant. Following the driving inward of the $n^+$-doped layers 16, a second insulation layer 17 is applied. The second insulation layer 17 is preferably a phosphorus-containing or boron-containing oxide.

The following process step provides for the structuring of the second insulation layer, with the aid of a further photo technique and an anisotropic etching down to the semiconductor surface. This means that the etching step stops at the semiconductor surface. As a result, not only the insulation layer 17 but also the $SiO_2$ layer 9 are substantially removed above the contact. At the location of the capacitor 20, the insulation layer 17 is structured in such a way that an insulation 18 remains between the semiconductor layer 12 and a metallization to be created later. As a result, of course, the $SiO_2$ layer 9 still remains as well.

In the next step, a metallizing layer 19, for instance of aluminum, is applied over the entire surface. The function of this layer is to contact the semiconductor material or to function as a conductor track. After metallizing layer 19 is applied, it is structured. The resultant structure is shown in FIG. 4.

The following steps for producing the semiconductor structures correspond to the steps known from the prior art. An insulation layer, typically TEOS, is deposited, planarized and structured. This is followed by the application and structuring of a second conductive layer, forming contacts between the first and second conductive layers. After that, a passivation layer can be applied.

I claim:

1. A method of producing a contact between a metallizing layer and a semiconductor material, which comprises the following steps:

forming a silicon nitride layer on a semiconductor material and structuring the silicon nitride layer;

forming a local $SiO_2$ layer by thermal oxidation;

introducing a further dopant into the semiconductor material and forcing the further dopant inward; and applying a metallizing layer on the semiconductor material.

2. The method according to claim 1, which comprises introducing a dopant into the semiconductor material prior to the thermal oxidation, and forcing the dopant inward by the thermal oxidation.

3. The method according to claim 1, which comprises, prior to the applying step, forming an insulation layer and anisotropically etching the insulation layer down to the semiconductor material and thereby also substantially removing the local $SiO_2$ layer.

4. The method according to claim 1, which further comprises thinning the local $SiO_2$ layer.

5. The method according to claim 1, which further comprises, subsequently to the step of forming the local $SiO_2$ layer, removing the silicon nitride layer.

* * * * *